(12) United States Patent
Bode et al.

(10) Patent No.: US 8,605,398 B2
(45) Date of Patent: Dec. 10, 2013

(54) ELECTRONIC DEVICE WITH PROTECTION CIRCUIT

(75) Inventors: Hubert Bode, Haar (DE); Mauro Giacomini, Bergamo (IT)

(73) Assignees: Freescale Semiconductor, Inc., Austin, TX (US); STMicroelectronics SRL, Agrate Brianza (IT)

( * ) Notice: Subject to any disclaimer, the term of this patent is extended or adjusted under 35 U.S.C. 154(b) by 0 days.

(21) Appl. No.: 13/389,179

(22) PCT Filed: Aug. 6, 2009

(86) PCT No.: PCT/IB2009/053447
§ 371 (c)(1),
(2), (4) Date: Feb. 6, 2012

(87) PCT Pub. No.: WO2011/015903
PCT Pub. Date: Feb. 10, 2011

(65) Prior Publication Data
US 2012/0134060 A1  May 31, 2012

(51) Int. Cl.
*H02H 3/22* (2006.01)
(52) U.S. Cl.
USPC .............................. 361/56; 361/111
(58) Field of Classification Search
USPC .................... 361/56, 111
See application file for complete search history.

(56) References Cited

U.S. PATENT DOCUMENTS

| | | | |
|---|---|---|---|
| 4,353,105 A | 10/1982 | Black | |
| 7,978,449 B2 * | 7/2011 | Carroll et al. | 361/56 |
| 2003/0043517 A1 | 3/2003 | Tsuji et al. | |
| 2003/0222704 A1 | 12/2003 | Okashita | |
| 2004/0188776 A1 | 9/2004 | Russ et al. | |
| 2005/0078419 A1 | 4/2005 | Stockinger et al. | |
| 2005/0286188 A1 | 12/2005 | Camp et al. | |
| 2007/0195472 A1 | 8/2007 | Kwak et al. | |
| 2008/0158749 A1 * | 7/2008 | Kwak et al. | 361/56 |
| 2010/0053827 A1 * | 3/2010 | Kawano | 361/56 |

FOREIGN PATENT DOCUMENTS

| | | |
|---|---|---|
| DE | 19958204 A1 | 12/1999 |
| JP | 3108368 A | 5/1991 |
| JP | 08-293583 A | 11/1996 |
| JP | 2008-502300 A | 1/2008 |

OTHER PUBLICATIONS

International Search Report and Written Opinion correlating to PCT/IB2009/053447 dated Apr. 28, 2010.

* cited by examiner

Primary Examiner — Danny Nguyen

(57) ABSTRACT

An electronic device comprises an application circuit; a first supply rail having a first electric potential; a second supply rail having a second electric potential different from the first electric potential; at least one terminal having a third electric potential, connected to the application circuit; and a protection circuit for protecting the application circuit from an injected current. The protection circuit comprises a first conductive line connected between the at least one terminal and the first supply rail, the first conductive line comprising a first switch having a first control input; and a first voltage amplifier circuit having a first input connected to the at least one terminal, a second input connected to the second supply rail and a first output connected to the first control input.

20 Claims, 4 Drawing Sheets

ELECTRONIC DEVICE WITH PROTECTION CIRCUIT

FIELD OF THE INVENTION

This invention in general relates to electronic devices and more specifically to an electronic device with an application circuit and a protection circuit for protecting the application circuit from an injected current.

BACKGROUND OF THE INVENTION

Electronic devices such as semiconductor integrated circuit devices are usually designed to function correctly with voltage levels between a positive supply voltage and a negative supply voltage or a ground potential. However, pushing a pin or terminal of an electronic device below the ground potential or above the positive supply voltage level may occur under certain circumstances. For example, an apparatus using circuitry requiring more than one supply voltage may malfunction and apply a higher voltage to a circuit requiring the lower supply voltage. This may cause injection of a current into the low voltage circuit or a connected circuit, harming correct functionality or even damaging or destroying the circuit.

Current injection may also be caused by excessive electrostatic discharge (ESD), when the electronic device is connected to an external terminal or pin. ESD is a sudden and momentary electric current that flows between two objects at different electrical potentials caused by direct contact or induced by an electrostatic field. ESD may for example be caused by human handling of the chip. It can result from electrostatic electricity, for example caused by tribocharging or by electrostatic induction when an electrically charged object is placed near a conductive object isolated from ground. An ESD event may occur when this object comes into contact with a conductive path. Due to size reduction in IC technologies, reduction of layer sizes has increased circuit sensitivity against ESD. Therefore, ESD protection has become an important focus of circuit development.

Current injection into pins or terminals of a silicon device may for example lead to device malfunction by means of carrier interaction in the substrate or by unwanted supply level modification which may hamper correct operation of the device or damage the device.

In the example shown in FIG. 1, an electronic device 10 contains a terminal 12 connected to an application circuit receiving signals from the terminal 12. The shown application circuit contains an analog-to-digital converter (ADC) 14, an n-channel metal-oxide semiconductor field effect transistor (NMOS FET) 18 and a p-channel MOS FET (PMOS FET) 20 and a resistor 16 for limiting the possible current injected into the terminal 12 into the ADC 14 interior circuit. The device receives a first and a second electric potential via supply rails 22, 24, for example $V_{cc}$ and $V_{ss}$, $V_{cc}$ and ground etc. In the event of current injection through the terminal 12, a voltage drop between the terminal and a supply rail may exceed $V_{BE}$ of the particular diode, switching the particular diode 26, 28 into a conductive state. The diodes 26, 28 may be diodes explicitly implemented for ESD protection of the application circuit or may be parasitic body diodes.

If for example supply rail 22 provides $V_{cc}$ and supply rail 24 provides ground level, an injected positive current, indicated by dashed arrow 30, can lift the supply voltage and inject majority carriers into the substrate of the semiconductor device in the case of p-type substrate based technology. For n-type substrate technology, this may inject minority carriers into the substrate. In the shown example, this may harm reliability of the ADC, if supply rail 22 provides a reference for the ADC and may push the voltage range beyond reliable limits and/or influence the reference of the ADC which may degrade conversion accuracy.

And for example in the case of p-type substrate technology, an injected negative current may inject minority carriers into the substrate and may cause a current flow, indicated by dashed arrow 32, in external circuits connected to the terminal. And the current injection may for example cause other nodes located on the same substrate to collect the minority carriers causing unintended current flow out of those nodes. The current injection may even result in latchup effects, i.e. creation of a low-impedance path between the power supply rails of a the circuit, triggering a parasitic structure which disrupts proper functioning of the part and possibly even leading to its destruction due to overcurrent.

SUMMARY OF THE INVENTION

The present invention provides an electronic device with an application circuit and a protection circuit for protecting the application circuit from an injected current as described in the accompanying claims.

Specific embodiments of the invention are set forth in the dependent claims.

These and other aspects of the invention will be apparent from and elucidated with reference to the embodiments described hereinafter. Identical reference numerals in different figures refer to identical or similar components.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Figure 1:
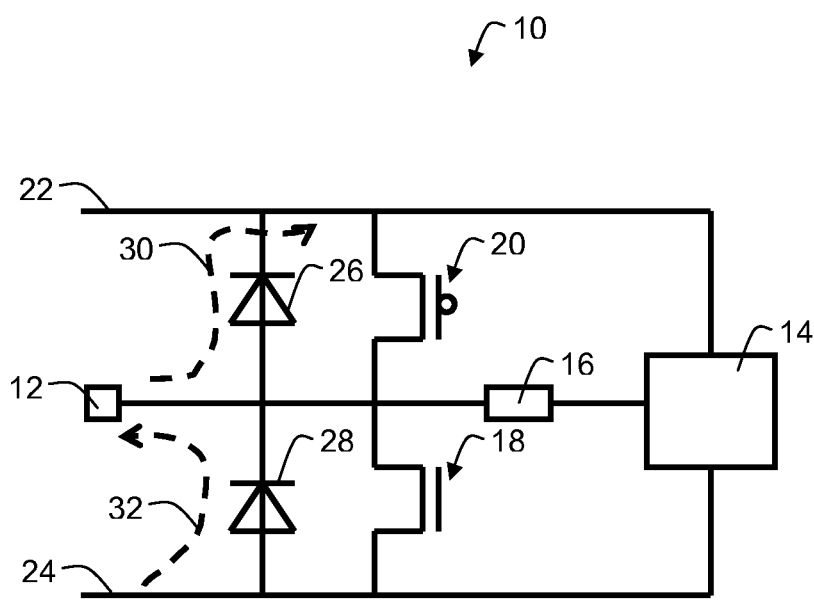
FIG. 1 shows a schematic diagram of an example of a prior art electronic device with a protection circuit.
Figure 2:
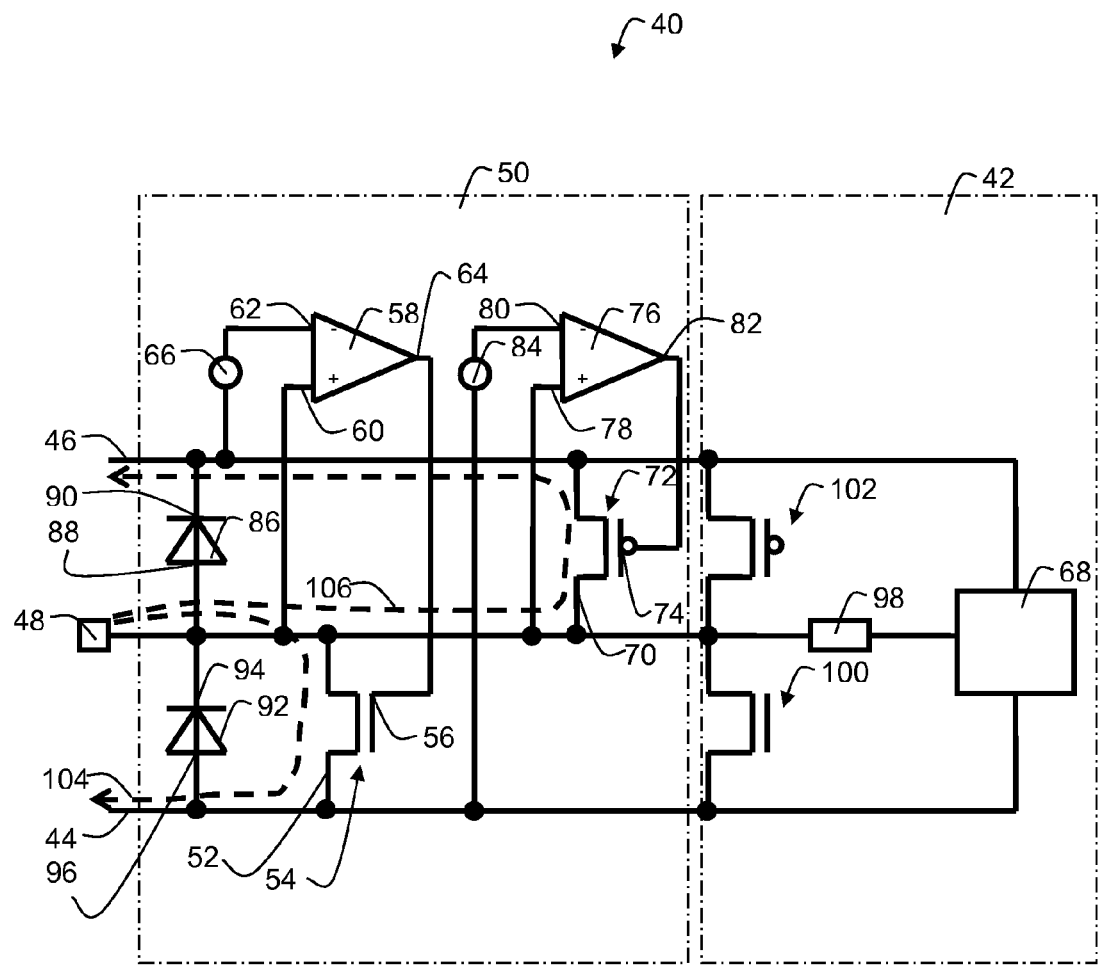
FIG. 2 shows a schematic diagram of an example of an embodiment of an electronic device with a protection circuit for protecting an application circuit against an injected current.

Referring to FIG. 2, a schematic diagram of an example of an embodiment of an electronic device 40 with a protection circuit 50 for protecting an application circuit 42 against an injected current is shown. The shown electronic device 40 comprises an application circuit 42; a first supply rail 44 having a first electric potential; a second supply rail 46 having a second electric potential different from the first electric potential; at least one terminal 48 having a third electric potential, connected to the application circuit 42; and a protection circuit 50 for protecting the application circuit 42 from an injected current. This protection circuit 50 comprises a first conductive line 52 connected between the at least one terminal 48 and the first supply rail 44, the first conductive line 52 comprising a first switch 54 having a first control input 56; and a first voltage amplifier circuit 58 having a first input 60 connected to the at least one terminal 48, a second input 62 connected to the second supply rail 46 and a first output 64 connected to the first control input 56.

Any two connected components may be considered electrically coupled.

The electronic device 40 may be a semiconductor integrated circuit device. It may for example comprise the shown application circuit 42. However, it should be noted that the application circuit 42 may comprise different components. The electronic device provides the first 44 and second 46 supply rails with different electric potentials or voltage levels. The first may be lower than the second or vice versa. For example, the first supply rail 44 may provide ground potential and the second supply rail may provide $V_{cc}$. As an example, these may be 0V (Volts) and +5V, respectively. However, other values may be possible, for example 0V and +12V, −5V and +5V, just to name a few. The supply rails 44, 46 may supply the application circuit 42 and the protection circuit 50.

The shown terminal 48 may be a single terminal or may be a schematic representation for a plurality of terminals or pins. A terminal may be an input terminal or an output terminal or a combined input/output terminal for receiving and providing electrical signals from or to an external device coupled to the terminal 48. The term terminal may refer not only to the terminating end of the connection between the application circuit 42 and an external device but may comprise the connecting line itself. The terminal 48 may have a varying third electric potential, depending on the transmitted or received electrical signal. However, the electric potential may also be subject to change due to an unwanted positive or negative current injected into the pin 48.

The described protection circuit 50 comprises a first voltage amplifier 58, which may be an active device such as a differential operational amplifier connected to sense the difference of potentials sensed at the first input 60, which may be connected to the pin 48, and at the second input 62. The potential received at the second input 62 may be the potential of the second supply rail 46. However, as described below, it may be provided with an offset.

The output 64 of the voltage amplifier 58 may be connected to deliver its comparison signal to a switch 54 connected to enable or disable the first conductive line 52 between the terminal and the first supply rail 44, i.e. the opposite supply rail to the second supply rail 46 sensed by the first voltage amplifier circuit 58. This may allow the injected current to flow through the enabled first conductive line 52 into the opposite supply rail, as indicated by the dashed arrow 104. Hence, the shown protection circuit may be configured to actively compensate for the injected current and allow for undisturbed operation instead of just detecting the event of a current injection or switching off the device. This may also avoid pin voltage levels which could open up parasitic bipolar elements.

The first switch 58 may for example be a metal oxide semiconductor field effect transistor (MOSFET). For better implementation in an integrated circuit, this may apply to any switch used in the presented electronic device. The first switch 54 may for example be a NMOS FET. However other switches may be used, for example a bipolar transistor, a PMOS FET or a CMOS circuit. The first control input 56 may be the gate of the MOSFET 54.

Depending on the amount of injected current, the shown conductive line may for example be implemented as a single conductive line or as a plurality of conductive lines. Generally, any shown component may be implemented as a single component or a plurality of components allowing the shown component to perform its task.

The shown mechanism to protect against current injection may for example be applied to sensitive or all pins of the electronic device.

The functionality of the described protection circuit may depend on which electric potential is applied to the first 44 and to the second supply rail 46. The first control input 56 may be arranged to enable a first current flow through the first conductive line 52 either when the first electric potential is lower than the second electric potential and the first voltage amplifier 58 receives the third electric potential on its first input 60 and an electric potential lower than the third electric potential on its second input 62 or when the first electric potential is higher than the second electric potential and the first voltage amplifier 58 receives the third electric potential on the first input and an electric potential higher than the third electric potential on the second input 62. If for example the electric potential or voltage level sensed at the pin 48 is above positive supply voltage (in the case it is directly applied to the first amplifier 58) or below negative supply voltage or ground, the first amplifier 58 may generate a control signal for the control input 56 of the first switching circuit 54 for enabling the first conductive line 52 and dissipating the injected current into the first supply rail 44.

A terminal 48 subject to current injection is therefore compared to the supply rails using voltage amplifiers. If the voltage level at the terminal exceeds the rail level the amplifier turns on the switching transistor which routes the injected current into the opposite supply rail, such neither the supply voltage level can be lifted, nor there will be relevant carrier injection into the substrate of the electronic device. The amount of allowed injected current (which gets actively compensated) may therefore be chosen and designed into the device.

The first 44 or the second supply rail 46 may for example be a ground rail having ground potential.

The opposite supply rail may then for example provide a positive or a negative voltage level, for example +5V or −5V, which may be a typical value for an electronic component encountering current injection in an automotive environment, since automotive circuitry is often based on multiple power supply voltages such as 12V and 5V.

In one of the embodiments of the presented electronic device 40 and as shown in FIG. 2, the second input 62 of the first amplifier 58 may not be directly connected to the second supply rail 46. Instead, the protection circuit 50 may comprise a first offset voltage source 66 connected between the second supply rail 46 and the second input 62 of the first voltage amplifier circuit 58. The shown first offset voltage source 66 may apply an offset voltage to the second input 62 of the first amplifier 58. If for example the second supply rail 46 provides a positive supply voltage level, the first offset voltage source 66 may provide an offset voltage level higher than the electric potential of the second supply rail 46. By selecting the size or transconductance of the switch 54 together with the open loop voltage gain of the voltage amplifier circuit 58, the amount of allowed current injection may be controlled, before the shown active protection circuit will enable the first conductive line 52 for consumption of the injected current. Therefore, depending on available circuit hardware parameters, the tolerable injected current may be chosen high or low. For example, for a supply voltage level of 5V, the offset above supply voltage level may be chosen to be less than 80 mV, for example 50 mV.

It should be noted that an offset voltage source may be any circuit capable of providing the chosen offset voltage level.

The application circuit 42 to be protected from malfunctioning due to an injected current may be any application circuit. As shown in the example, the application circuit may comprise an analog-to-digital converter (ADC) (68). Changes in the voltage supply of an ADC, for example caused by an injected current into a supply rail lifting or lowering the particular potential to a value outside of the allowed voltage range may cause malfunctioning of the ADC due to incorrect references when converting the applied analog signal. This may be at least partly be avoided the presented protection circuit arranged to direct injected current into the opposite supply rail. Therefore, the ADC may allow for higher acceptable injection current specification values without the need to decrease the precision of measurement of other channels in a sizable way. The example application circuit 42 may also comprise a resistor 98 and field effect transistors 100, 102.

As described above, a protection circuit 50 may comprise circuitry for protection against an injected current having a particular direction, i.e the injected current flow may either be a positive or a negative current flow. However, the type of expected current injection may not be known in advance or may be different for different circumstances. Therefore, the protection circuit 50 may comprise a second conductive line 70 connected between the at least one terminal 48 and the second supply rail 46, the second conductive line 70 comprising a second switch 72 having a second control input 74; and a second voltage amplifier circuit 76 having a third input 78 connected to the at least one terminal, a fourth input 80 connected to the first supply rail 44 and a second output 82 connected to the second control input 74. This may allow for protection of the application circuit 42 against positive and negative current injection.

The second control input 74 may be arranged to enable a second current flow 106 through the second conductive line 70 when the first electric potential is lower than the second electric potential and the second voltage amplifier 76 receives the third electric potential on the third input 78 and an electric potential lower than the third electric potential on the fourth input 80 or when the first electric potential is higher than the second electric potential and the second voltage amplifier 76 receives the third electric potential on the third input 78 and an electric potential higher than the third electric potential on the fourth input 80. The provided embodiment of the protection circuit may therefore allow directing injected current into the opposite supply rail, either into the first or the second supply rail 44, 46, depending on the electric potentials of the supply rails and on the direction of the injected current flow.

The protection circuit 50 may comprise a second offset voltage source 84 connected between the first supply rail 44 and the fourth input 80. This may allow to apply a voltage level having a relative offset compared to the electric potential of the first supply rail. The relative offset provided by the second offset voltage source 84 may for example be the same as the relative offset provided by the first offset voltage source 66. For example, the second electric potential of the second supply rail 46 may be +5V and the first offset voltage level may be 50 mV higher and the first electric potential of the first supply rail 44 may be 0V ground potential and the second offset voltage level may be 50 mV below 0V. However, different offset voltage levels may be applied to the first and second voltage amplifier circuits 58, 76.

The protection circuit may comprise a first diode 86 having a first anode 88 connected to the at least one terminal 48 and a first cathode 90 connected to the second supply rail 46 and/or a second diode 92 having a second cathode 94 connected to the at least one terminal 48 and a second anode 96 connected to the first supply rail 44. Although parasitic diodes may be activated when a voltage drop of at least $V_{BE}$, which may for example be about 0.7V, occurs between the pin 48 and either the first 44 or the second supply rail 46, diodes implemented purposefully between the pin 48 and the supply rails 44, 46 may be used for a secondary protection mechanism, if the injected current exceeds the chosen level of protection. However, circuit designer may add a current limiting to the external circuitry connected to the pin 48 in order to avoid situations which are outside of the planned range of acceptable current injection.

Figure 3:
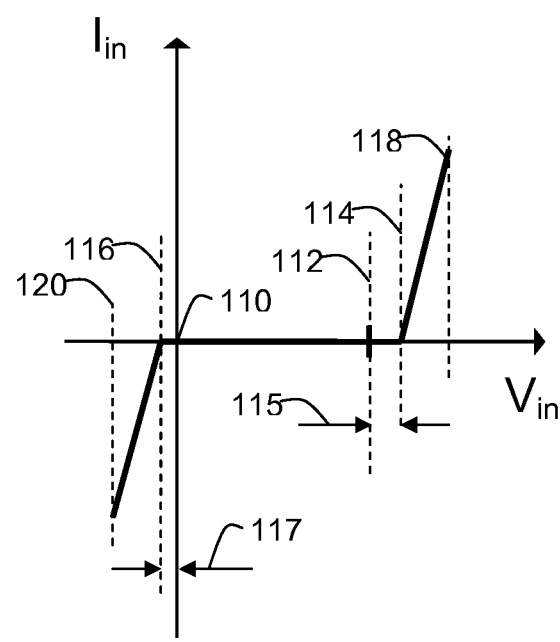
FIG. 3 shows a schematic diagram of a current injected at a terminal of the electronic device vs. a voltage sensed at the terminal.

Referring now also to FIG. 3, a schematic diagram of a current injected at a terminal of the electronic device vs. a voltage sensed at the terminal is shown. The diagram shows an example of an injected current $I_{in}$ level over the voltage level $V_{in}$ at the pin (i.e. the voltage drop between the pin 48 and the supply rail having ground potential) of the electronic device which receives a positive second electric potential or supply voltage level 112 and ground potential 110. Corresponding to the embodiment of the electronic device shown in FIG. 2, two relative offset voltage levels 115, 117 are provided to the electronic circuit.

If current is pushed into the circuit by a connected external circuit, the potential at the pin or terminal may be changed so far that the injected current driven by the externally connected circuit flows through the pin. The described protection circuit may limit the potential $V_{in}$ at the pin 48 such that no or only very few parasitic internal bipolar structures become activated. Thus there may be no or only very few minority carrier injection and no or only very few supply voltage level changes. However, if the drop voltage exceeds the upper or lower limits 114, 116 of input potentials at the first input of the first voltage amplifier 58 and at the third input of the second voltage amplifier 76, current injection into the opposite supply rails may occur. The provided circuit allows for selecting the steepness of increase in $I_{in}$ by selecting the gain of the voltage amplifier circuits and the transconductance of the implemented switching transistors. Therefore, by selecting the relative offset voltages 115, 117, the amplifier gains and transistor transconductances, the protection circuit may be sized to be able to withstand any desired level of injected current.

Minimum 120 and maximum 118 $V_{in}$ may denote the limits of the described mechanism, when malicious current injection or supply voltage level lifting begins. For the presented electronic circuit, an input impedance of the terminal or pin 48 shown in FIG. 2 may for example be very high or infinite as long as the input potential is between upper and lower supply level bounds, i.e. the electric potentials of the first and second supply rails. Selecting the offset may allow to prevent that the protection circuit does not get activated as long as the input voltage level stays within bounds. In the case of current injection, the electric potential at the pin may rise beyond upper or lower supply level (for example ground level) to the point when the current injected is consumed by the electronic circuit. The shown protection circuit may take care that this happens at a pin potential $V_{in}$ which for positive current lies between the upper limit 114 and a maximum 118 of the upper limit plus 1 $V_{BE}$, respectively between the lower limit 116 and a minimum 120 of the lower limit minus 1 $V_{BE}$, at which any parasitic bipolar structure may start to open up. A tolerable amount of injected current is given by the $I_{in}/V_{in}$, input transfer function shown in FIG. 3 having a steepness between $V_{in}$ levels 114 and 118, and 116 and 120, respectively, high enough to keep the maximum 118 below the upper limit 114 plus 1 $V_{BE}$ and the minimum 116 above the lower limit 116 minus 1 $V_{BE}$. This may be achieved by choosing suitable gains of the first or second voltage amplifiers 58, 76 and/or sizes of the switches or pass transistors 54, 72.

The protection circuit may for example be implemented such that current injection beyond maximum 118 or minimum 120 may be controlled for example by diodes 86, 92 or by an external current limiting.

In order to allow for adjusting the protection circuit to different situations of current injection, the electronic circuit 40 may be provided such that the first voltage amplifier circuit 58 has an adjustable gain. However both amplifiers 58, 76 may have adjustable gains; and even offset voltages may be adapted.

Figure 4:
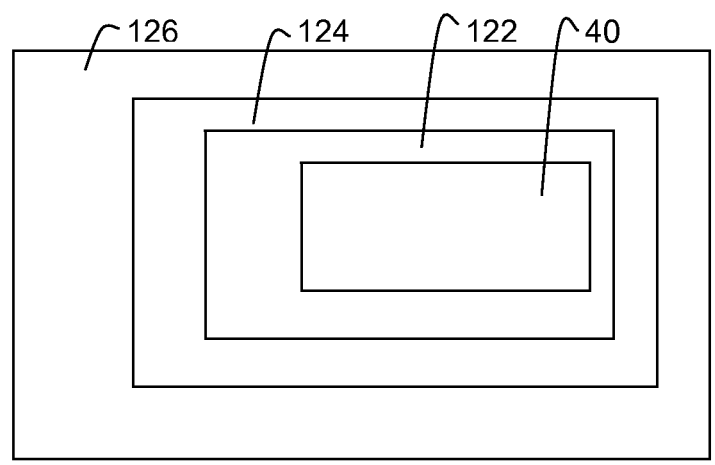
FIG. 4 shows a schematic diagram of a vehicle comprising a safety critical system with an engine control unit with the electronic device.

Referring now also to FIG. 4, a schematic diagram of a vehicle 126 comprising a safety critical system 124 with an engine control unit 122 with the electronic device 40 is shown. An engine control unit (ECU) 122 may comprise an electronic circuit as described above. An ECU may be a part of a safety critical system. A safety critical system 124 may comprise an ECU or an electronic circuit as described above. And a vehicle 126 may for example comprise a safety critical system or an ECU or an electronic circuit 40 described above.

A vehicle 126 may for example be a car, a plane, a ship, a helicopter etc. A safety critical system 124 may for example comprise an ECU 122. An engine control unit (ECU), or engine control module (ECM), is an electronic control unit which controls various aspects of an internal combustion engine's operation. An ECU may for example control the quantity of fuel injected into each cylinder. An ECU may for example also control the ignition timing, variable valve timing (VVT), the level of boost maintained by the turbocharger (in turbocharged cars), and other peripherals. However, a safety critical system, wherein possible uncompensated current injection may affect device operation, may be found in a non-automotive environment. Or an automotive safety critical system may be, for example, a car safety system. A safety critical system may comprise a seat position control system, lighting, windscreen wipers, immobilizers, electronic climate control, a brake system or an electrical steering system. A brake system may comprise, for example, an anti-lock braking system (ABS), an electronic brakeforce distribution system (EBD), a cornering brake control (CBC) system etc. An electrical steering system may comprise, for example, an electronic stability control system (ESC), a traction control system (TCS) or anti-slip regulation system (ASR), an adaptive cruise control (ACC) system, a forward collision warning (FCW) system etc. However, the provided electronic device with protection from current injection may also be used for other car systems, such as the dashboard.

For example any apparatus comprising multi power supplies may be encounter current injection due to voltage levels above or below allowed supply levels.

For example, a household appliance, such as for example a washing machine using different voltages for running an electric motor or a pump and for the electronic circuitry such as the processor may comprise an electronic circuit as described above for protection against current injection.

In the foregoing specification, the invention has been described with reference to specific examples of embodiments of the invention. It will, however, be evident that while the principles of the invention have been described above in connection with specific apparatus, it is to be clearly understood that this description is made only by way of example and not as a limitation on the scope of the invention and that various modifications and changes may be made therein without departing from the broader spirit and scope of the invention as set forth in the appended claims.

For example, the connections may be any type of connection suitable to transfer signals from or to the respective nodes, units or devices, for example via intermediate devices. Accordingly, unless implied or stated otherwise the connections may for example be direct connections or indirect connections. Furthermore, the conductive lines may be implemented in a different manner than shown in the examples.

Also, the devices may be physically distributed over a number of apparatuses, while functionally operating as a single device. For example, the example of an electronic device shown in FIG. 2 may be implemented using a plurality of protection circuits or a combination of the shown protection circuit with other protection circuits.

The electronic device may be implemented as a semiconductor device on a substrate of any semiconductor material or combinations of materials, such as gallium arsenide, silicon germanium, silicon, monocrystalline silicon, the like, and combinations of the above, just to name a few.

Although the invention has been described with respect to specific conductivity types or polarity of potentials, skilled artisans appreciated that conductivity types and polarities of potentials may be reversed.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An electronic device, comprising:
    an application circuit;
    a first supply rail having a first electric potential;
    a second supply rail having a second electric potential different from said first electric potential;
    at least one terminal having a third electric potential, connected to said application circuit; and
    a protection circuit for protecting said application circuit from an injected current; said protection circuit comprising:

a first conductive line connected between said at least one terminal and said first supply rail, said first conductive line comprising a first switch having a first control input; and a first voltage amplifier circuit having a first input connected to said at least one terminal, a second input connected to said second supply rail, and a first output connected to said first control input.

2. The electronic circuit as claimed in claim 1, wherein said first control input is arranged to enable a first current flow through said first conductive line:

when said first electric potential is lower than said second electric potential and said first voltage amplifier receives said third electric potential on said first input and an electric potential lower than said third electric potential on said second input; or when said first electric potential is higher than said second electric potential and said first voltage amplifier receives said third electric potential on said first input and an electric potential higher than said third electric potential on said second input.

3. The electronic circuit as claimed in claim 1, wherein said first or said second supply rail is a ground rail having ground potential.

4. The electronic circuit as claimed in claim 1, wherein said protection circuit further comprises a first offset voltage source connected between said second supply rail and said second input.

5. The electronic circuit as claimed in claim 1, wherein said application circuit comprises an analog-to-digital converter.

6. The electronic circuit as claimed in claim 1, wherein said protection circuit comprises:

a second conductive line connected between said at least one terminal and said second supply rail, said second conductive line comprising a second switch having a second control input; and a second voltage amplifier circuit having a third input connected to said at least one terminal, a fourth input connected to said first supply rail and a second output connected to said second control input.

7. The electronic circuit as claimed in claim 6, wherein said second control input is arranged to enable a second current flow through said second conductive line:

when said first electric potential is lower than said second electric potential and said second voltage amplifier receives said third electric potential on said third input and an electric potential lower than said third electric potential on said fourth input or when said first electric potential is higher than said second electric potential and said second voltage amplifier receives said third electric potential on said third input and an electric potential higher than said third electric potential on said fourth input.

8. The electronic circuit as claimed in claim 6, wherein said protection circuit comprises a second offset voltage source connected between said first supply rail and said fourth input.

9. The electronic circuit as claimed in claim 1, wherein said protection circuit further comprises one or more of:

a first diode having a first anode connected to said at least one terminal and a first cathode connected to said second supply rail; and a second diode having a second cathode connected to said at least one terminal and a second anode connected to said first supply rail.

10. The electronic circuit as claimed in claim 1, wherein said first switch is a metal oxide semiconductor field effect transistor.

11. The electronic circuit as claimed in claim 1, wherein said first voltage amplifier circuit has an adjustable gain.

12. An engine control unit, comprising an electronic circuit as claimed in claim 1.

13. A safety critical system, comprising a ECU as claimed in claim 12.

14. A vehicle, comprising a safety critical system as claimed in claim 13.

15. A household appliance, comprising an electronic circuit as claimed in claim 1.

16. The electronic circuit as claimed in claim 2, wherein said protection circuit further comprises a first offset voltage source connected between said second supply rail and said second input.

17. The electronic circuit as claimed in claim 2, wherein said protection circuit comprises:

a second conductive line connected between said at least one terminal and said second supply rail, said second conductive line comprising a second switch having a second control input; and a second voltage amplifier circuit having a third input connected to said at least one terminal, a fourth input connected to said first supply rail and a second output connected to said second control input.

18. The electronic circuit as claimed in claim 17, wherein said second control input is arranged to enable a second current flow through said second conductive line:

when said first electric potential is lower than said second electric potential and said second voltage amplifier receives said third electric potential on said third input and an electric potential lower than said third electric potential on said fourth input; or when said first electric potential is higher than said second electric potential and said second voltage amplifier receives said third electric potential on said third input and an electric potential higher than said third electric potential on said fourth input.

19. The electronic circuit as claimed in claim 17, wherein said protection circuit comprises a second offset voltage source connected between said first supply rail and said fourth input.

20. The electronic circuit as claimed in claim 17, wherein said protection circuit further comprises one or more of:

a first diode having a first anode connected to said at least one terminal and a first cathode connected to said second supply rail; and a second diode having a second cathode connected to said at least one terminal and a second anode connected to said first supply rail.

* * * * *